(12) United States Patent
Kitabatake et al.

(10) Patent No.: US 6,270,573 B1
(45) Date of Patent: Aug. 7, 2001

(54) SILICON CARBIDE SUBSTRATE, AND METHOD FOR PRODUCING THE SUBSTRATE, AND SEMICONDUCTOR DEVICE UTILIZING THE SUBSTRATE

(75) Inventors: Makoto Kitabatake, Nara; Masao Uchida, Ibaraki; Kunimasa Takahashi, Yamatokoriyama, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/297,129
(22) PCT Filed: Aug. 27, 1998
(86) PCT No.: PCT/JP98/03826
  § 371 Date: Apr. 26, 1999
  § 102(e) Date: Apr. 26, 1999
(87) PCT Pub. No.: WO99/10919
  PCT Pub. Date: Mar. 4, 1999

(30) Foreign Application Priority Data

Aug. 27, 1997 (JP) .................................................. 9-230770

(51) Int. Cl.$^7$ ............................. C30B 25/18; C30B 29/36
(52) U.S. Cl. ............................. 117/95; 117/97; 117/101; 117/106; 117/913; 117/923; 117/951; 423/345; 428/627; 428/641
(58) Field of Search ............................. 117/95, 97, 101, 117/106, 913, 923, 951; 423/345; 428/627, 641

(56) References Cited

U.S. PATENT DOCUMENTS

| | | | |
|---|---|---|---|
| 4,912,063 | 3/1990 | Davis et al. | 437/100 |
| 4,946,547 | 8/1990 | Palmour et al. | 156/643 |
| 5,011,549 | 4/1991 | Kiong et al. | 148/33.1 |
| 5,037,502 | 8/1991 | Suzuki et al. | 156/610 |
| 5,200,022 | 4/1993 | Kong et al. | 156/612 |
| 5,230,768 | * 7/1993 | Furukawa et al. | 117/951 |
| 5,272,107 | 12/1993 | Suzuki et al. | 437/100 |
| 5,363,800 | * 11/1994 | Larkin et al. | 117/95 |
| 5,529,949 | 6/1996 | Stan et al. | 437/100 |
| 5,766,343 | * 6/1998 | Dmitriev et al. | 117/951 |

FOREIGN PATENT DOCUMENTS

| | | |
|---|---|---|
| 59-027544 | 2/1984 | (JP) . |
| 63-047984 | 2/1988 | (JP) . |
| 63-179516 | 7/1988 | (JP) . |
| 2-172894 | 7/1990 | (JP) . |
| 2-177534 | 7/1990 | (JP) . |
| 4-372122 | 12/1992 | (JP) . |
| 7-172997 | 7/1995 | (JP) . |
| WO 91/06116 | 5/1991 | (WO) . |

OTHER PUBLICATIONS

T. Kimoto et al., Japan Applied Physics, vol. 73, No. 2, Jan. 15, 1993, pp 726–732 "Growth mechanism of 6H–SiC in step–controlled epitaxy".

* cited by examiner

Primary Examiner—Robert Kunemund
(74) Attorney, Agent, or Firm—Parkhurst & Wendel, LLP

(57) ABSTRACT

A silicon carbide thin film is epitaxially grown by an MBE or the like method with silicon atoms 2 being maintained to be in excess of carbon atoms on a growth surface 1a of a silicon carbide crystal in a substrate 1. A silicon carbide substrate with a good crystallinity is thereby achieved at a low temperature with a good reproducibility. This crystal growth is possible at a low temperature of 1300° C. or lower, and the productions of a high-concentration doped film, a selectively grown film, and a grown film of a cubic silicon carbide on a hexagonal crystal are achieved. In crystallizing a cubic silicon carbide on a hexagonal crystal, the use of an off-cut surface inclined towards a <1$\bar{1}$00> direction is effective to prevent an occurrence of twin.

40 Claims, 10 Drawing Sheets

(000$\bar{1}$) face (C face)
3 × 3 surface reconstruction
Deposited silicon coverage rate=17/9

- ● 3rd deposited silicon layer
- ○ 2nd deposited silicon layer
- ○ 1st deposited silicon layer — Deposited Si
　　　　　　　　　　　　　　　　↑
——————————————————————— Surface
　　　　　　　　　　　　　　　　↓
- ○ 1st carbon layer　　　　　Substrate
- ○ 2nd silicon layer

- 3rd deposited silicon layer
- ○ 2nd deposited silicon layer
- ◯ 1st deposited silicon layer        Deposited Si
———————————————————————— Surface
       ○ 1st silicon layer              Substrate
       ○ 2nd carbon layer

SILICON CARBIDE SUBSTRATE, AND METHOD FOR PRODUCING THE SUBSTRATE, AND SEMICONDUCTOR DEVICE UTILIZING THE SUBSTRATE

TECHNICAL FIELD

This invention relates to a silicon carbide substrate having a hexagonal or cubic crystal structure, a silicon carbide substrate in which crystal layers each having a different crystal system are stacked, and a producing method of the silicon carbide substrate by utilizing homoepitaxial growth or heteroepitaxial growth, and a semiconductor device utilizing these silicon carbide substrates.

BACKGROUND ART

In recent years, silicon carbide crystals have drawn considerable attention in the industry because of their advantageous properties as a semiconductor material, such as a large band gap, high saturated electron drift velocity, and high thermal conductivity. Single crystalline substrates made of 6H or 4H hexagonal silicon carbide are commercially available and used. Among them, a cubic silicon carbide has been particularly expected for use in a semiconductor device with high speed and high power operation. However, the cubic silicon carbide is very difficult to be developed into a large single crystal usable as a substrate, and for this reason, a thin film heteroepitaxially grown on a single crystalline silicon or the like has been conventionally used.

Such silicon carbide crystals as above are usually formed by an atmospheric pressure CVD and the like method under a high temperature over 1300° C., normally around 1500° C., using a mixed gas of silane and propane as a source gas, and hydrogen as a carrier gas.

Nonetheless, the growth mechanism of a silicon carbide crystal has not yet been fully understood, and, therefore, an industrial technique for epitaxially growing a silicon carbide thin film with high reproducibility by controlling the relationship between an amount of a source gas to be supplied and a temperature of the substrate has not yet been established with full knowledge thereof. As a consequence, conventional production methods for a silicon carbide substrate have various drawbacks such as described below.

Firstly, since high temperatures as mentioned above are required for the crystal growth of silicon carbide, it has been difficult to grow a crystal in a selective area by using masking, and to carry out a nitrogen doping with high concentration. Specifically, since there is no suitable material for masking sufficiently resistant to such high temperatures, it is difficult to grow a crystal only in a predetermined region by patterning. In addition, silicon carbide is difficult to be subjected to a selective etching, and therefore it is difficult to form desired semiconductor devices and semiconductor circuits using silicon carbide. In addition, if a nitrogen doping is carried out under such a high temperature as above, the resulting film of the grown crystal is susceptible to roughness, and therefore a doping with a high concentration such as approximately more than $5 \times 10^{18}$/$cm^3$ is difficult to attain. Furthermore, in a crystal growth at a high temperature, the decomposition, attaching to a surface of the substrate, re-evaporation and the like mechanisms of a supplied source gas are so complicated that it is rendered more difficult to, for example, epitaxially grow a silicon carbide thin film with a high reproducibility by controlling the relationship between the amount of the source gas to be supplied and the temperature of the substrate. It is noted that T. Kimoto et al. suggest on pp. 726–732 in the *Journal of Applied Physics*. Vol. 73, No. 2 (1993) a technique of forming a 6H silicon carbide crystal at a relatively low temperature by employing a silicon carbide substrate having an off-cut surface towards a [11$\bar{2}$0] direction of a {0001} face by using a step-flow growth and the like. However, even with this technique, it is required that the substrate be heated at approximately 1200° C.

Secondly, a single crystal thin film composed of hexagonal or cubic silicon carbide with a good crystallinity is difficult to be epitaxially grown. In particular, when a cubic silicon carbide crystal is formed on a silicon substrate, a large lattice mismatch occurs and therefore a good crystallinity is difficult to obtain. In addition, when a cubic silicon carbide crystal is formed on a 6H hexagonal silicon carbide crystal, the resulting cubic silicon carbide crystal is apt to contain double positioning boundaries caused by the occurrence of twin. It is noted that the present inventors have disclosed in Japanese Unexamined Patent Publication No. 07-172997 a method for producing a cubic silicon carbide thin film having a (001) face by having silicon atoms present in excess of carbon atoms on the growth surface of a silicon carbide crystal, and a method for producing a cubic silicon carbide thin film having (111) surface or a hexagonal carbon silicon thin film having (0001) surface by having carbon atoms present in excess of silicon atoms on the growth surface of a silicon carbide crystal. However, even with these methods, it has been difficult to suppress the occurrence of twin certainly or drastically although a relatively good crystallinity can be obtained thereby.

Moreover, it has not yet been made possible to heteroepitaxially grow on a silicon carbide substrate a silicon carbide crystal having a different crystal system from a crystal system of the substrate. For example, in the case of a step-flow growth of a silicon carbide crystal on a hexagonal silicon carbide substrate, the resulting silicon carbide crystal is apt to retain a hexagonal structure because the crystal structure of the substrate tends to restrict the resulting crystal, and it is therefore difficult to heteroepitaxially grow a cubic carbon carbide on such a substrate.

In view of the above problems, it is an object of the present invention to provide a method for producing a silicon carbide substrate that it is capable of epitaxially growing a silicon carbide having a good crystallinity at a relatively low temperature, that a crystal growth in a selective region by masking and a high concentration nitrogen doping are easily carried out, and that silicon carbides each having a different crystal system are heteroepitaxially grown and stacked with a good interface therebetween.

It is another object of the present invention to provide a silicon carbide substrate produced by the above method.

It is further another object of the present invention to provide a semiconductor device capable of high-speed operation utilizing the above silicon carbide substrate.

DISCLOSURE OF THE INVENTION

The present inventors have found that, by controlling an existence ratio of carbon and silicon on a growth surface of a silicon carbide crystal so that silicon atoms are in excess of carbon atoms, a smooth surface can be obtained in a good reproducibility even at a relatively low temperature, and that a high quality epitaxial thin film can be thereby obtained. The present invention has been completed based on these findings. The more detailed description now follows.

As shown in FIG. 1, on a silicon carbide crystal growth surface 1*a* of a substrate 1, an excessive silicon atom 2 bonded with the substrate 1 by a Si—Si bond 3 tends to be actively diffused on the growth surface 1a. This is because the Si—Si bond 3 is a weaker bond than a C—Si bond and a C—C bond of carbon atoms. Therefore, when carbon atoms are supplied under the condition in which silicon atoms are in excess of carbon, silicon atoms tend to be bonded with the substrate 1 and carbon atoms at an accurate lattice position, and thereby a good crystallinity with an excellent uniformity and flatness can be easily obtained even at a relatively low temperature. It should be noted here that, as previously described, the present inventors disclosed in Japanese Unexamined Patent Publication No. 07-172997 a technique in which silicon atoms are supplied in excess in the case of a cubic silicon carbide having (001) face and carbon atoms are supplied in excess in the case of a hexagonal silicon carbide having (0001) face. However, the present inventors have discovered that, if silicon atoms are supplied slightly in excess of carbon atoms in the cases of (0001) face and the like faces as well, a more favorable crystallinity can be obtained according to the above-described mechanism.

As previously described, an even more favorable crystallinity is obtained if a surface of the crystal growth is an off-cut surface inclined from 0.05° to 10° with respect to a predetermined crystal face. This is because as the result of the growth surface being off-cut, a terrace 4 and a step edge 5 is formed on the growth surface as shown in FIG. 2, and a step-flow growth 6, in which the step edge 5 is grown on the terrace 4, takes place consequently. The fact that silicon atoms are easily diffused as described above promotes such step-flow growth 6, and hence enables an epitaxial growth even at a low temperature. If the off-cut angle is smaller than 0.05° with respect to the crystal orientation, a long time or a high temperature becomes necessary to grow a good thin film, since the terrace becomes too wide and thereby a long distance surface diffusion is required for the step-flow growth. On the other hand, if the off-cut angle is larger than 10° with respect to the crystal orientation, a surface roughness is likely to be induced since a density of the step edge becomes too high and thus an occurrence of two-dimensional nucleation from the step edge and the like is caused.

Regarding a direction of the off-cut, a most suitable terrace and step edge for a good step-flow growth is obtained when the off-cut surface is inclined towards a <1$\bar{1}$00> direction or a <11$\bar{2}$0> direction in the case of hexagonal silicon carbide. In the case of the off-cut surface of a <11$\bar{2}$0> direction, the step edge 5 prior to the crystal growth is a <11$\bar{2}$0> direction as shown in FIG. 3(a), and the step edges of the step-flow growth 6 result in two <11$\bar{2}$0> directions making an angle of 120° with respect to the <11$\bar{2}$0> direction of the inclined direction of the off-cut surface. Thus, the step-flow growth takes place forming step edges with a serrated blade-like shape. It is noted here that growing portions 6a and 6b of the step-flow growth are an identical crystal in the case of a hexagonal crystal, and therefore a good crystallinity is obtained. However, in this case, there occur some cases where a step bunching, in which growth steps are overlapped, becomes conspicuous as the crystal growth proceeds, and as a result a roughness of the growth surface increases. In order to reduce such roughness of the growth surface, it is effective to employ an off-cut surface inclined towards a <1$\bar{1}$00> direction, according to the findings by the present inventors. In this case, a good crystallinity is achieved, the step bunching is suppressed, and thereby a silicon carbide substrate with a very flat growth surface is obtained. Such a silicon carbide substrate is useful in such cases that a micromachining is required and the like cases.

In contrast, if an off-cut surface inclined towards the <11$\bar{2}$0> direction is employed in the case of a crystal growth of cubic crystal, the growing portions 6a and 6b result in the crystals with a mirror image of each other, and therefore double positioning boundaries are formed. Such double positioning boundaries are not reduced as the crystal growth continues. In view of this, the present inventors have found that, as shown in FIG. 3(b), a crystal growth that does not cause twin boundaries as above is achieved by employing an off-cut surface inclined towards the <1$\bar{1}$00> direction even in the cases of growing cubic crystals. In this case, a linear step edge 5 with the <11$\bar{2}$0> direction is formed both before and after the crystal growth, growing portions 6d to 6f of the step-flow growth 6 result in the same crystal, and a good crystallinity with a single phase is obtained. More specifically, it is possible to obtain a cubic silicon carbide crystal including a defect free crystal surface with an area of 1 mm square or larger. It is noted here that the effect of the above-described off-cut direction is exhibited when a component of the <1$\bar{1}$00> direction in the off-cut direction is larger than a component of the <11$\bar{2}$0> direction, even if the direction is slightly off from the <1$\bar{1}$00> direction.

In order to maintain an appropriate quantity of silicon atoms in excess, it is preferable that a surface reconstruction structure of the growth surface be used as a guideline. Specifically, in the case where a hexagonal crystal is grown on a surface of a (0001) face (Si face) of a hexagonal crystal for example, a good crystal growth is achieved by controlling the supply of silicon atoms and carbon atoms so that the surface structure falls between approximately a 1×1 surface structure and approximately a $\sqrt{3}\times\sqrt{3}$ surface reconstruction structure. Likewise, in the cases where a cubic crystal is grown on a (0001) face (Si face) of a hexagonal crystal or on a (111) face (Si face) of a cubic crystal, a hexagonal crystal is grown on a (000$\bar{1}$) face (C face) of a hexagonal crystal, and a cubic crystal is grown on a (000$\bar{1}$) face (C face) of a hexagonal crystal or a ($\bar{1}\bar{1}\bar{1}$) face (C face) of a cubic crystal, it is preferable that the supply control of silicon atoms and carbon atoms be carried out so that the surface structure falls between approximately 1×1 and 3×3.

By attaining the above-described surface reconstruction states, it is possible to supply the silicon atoms that actively diffuse on the growth surface of a silicon carbide crystal, and to suppress a deposition of silicon crystal grains. It is to be understood that the supply control is not necessarily carried out so that the surface structure is changed throughout the above ranges, and that the supply control may be such that the surface structure falls within the ranges. For example, in the case of a cubic crystal grown on a (0001) face (Si face) of a hexagonal crystal, the supply control may be carried out so that the surface structure falls between $\sqrt{3}\times\sqrt{3}$ and 3×3, or results in a certain state of a surface reconstruction structure between $\sqrt{3}\times\sqrt{3}$ and 3×3. In addition, it is not essential that the detection of the surface reconstruction structure be carried out during the supply control. The detection of the surface reconstruction structure may be carried out in advance, and the amounts of silicon atoms and carbon atoms to be supplied and the pattern of supplying them may be accordingly determined, and a crystal growth may be carried out without such a step of detecting the surface reconstruction structure in the manufacturing step.

In addition, it is preferable that silicon atoms present in excess on the growth surface of a silicon carbide crystal be not more than 5 atomic layers in order to prevent a degradation of the crystallinity and flatness of the grown thin film caused by a deposition of silicon crystal grains on the growth surface of the silicon carbide crystal.

In addition, when the supply of silicon atoms and carbon atoms is carried out in such a manner that one of them or both are intermittently supplied, such a state that silicon atoms are present in excess is easily maintained. In particular, in the case where silicon atoms and carbon atoms are alternately supplied on the growth surface of the silicon carbide crystal, it is possible to change the state of the surface dynamically, and therefore the state of silicon being present in excess can be more readily controlled. However, silicon atoms may be consecutively supplied while carbon atoms are being intermittently supplied. In this case, the state of silicon atoms being in excess is easily maintained for a long time, and therefore a silicon carbide thin film with a more favorable crystallinity can be obtained. Further, the number of excessive silicon atoms can be appropriately maintained with ease by supplying only silicon atoms until a surface reconstruction structure of approximately √3×√3 or 3×3 is obtained, and supplying carbon atoms until a surface structure of approximately 1×1 is obtained.

A temperature of the growth surface of the silicon carbide crystal is preferably within the range of 600° C. to 1300° C. If the temperature is lower than 600° C., the diffusion of silicon atoms becomes insufficient, and therefore it becomes difficult to obtain the above-described effects. On the other hand, if the temperature of the growth surface exceeds 1300° C., the resulting crystal becomes unsuitable for the selective growth of a silicon carbide thin film and the high-concentration nitrogen doping, which are described later, as seen in conventional high-temperature CVD methods. It is noted however that the effect of achieving a silicon carbide crystal with a good crystallinity remains obtainable even if the temperature exceeds 1300° C.

Regarding a doping of nitrogen, nitrogen can be doped in a silicon carbide thin film by supplying a nitrogen-containing reactive gas such as ammonia on the growth surface of a silicon carbide crystal. Because the crystal growth of the silicon carbide crystal takes place at a relatively low temperature, as described above, it is possible to easily obtain a silicon carbide thin film with a good crystallinity containing nitrogen of high concentration in substitutional sites. Specifically, it is possible to achieve a silicon carbide thin film containing nitrogen atoms of $5 \times 10^{18}/cm^3$ or more, or even further $10^{19}$ to $5 \times 10^{19}/cm^3$ or more.

In such crystal growth of the above temperature range, because the thin film formation is carried out at a low temperature range, it is possible to provide a masked region in a part of the growth surface by a silicon oxide thin film for example, and to grow a silicon carbide thin film in the remaining region other than the masked region. In conventional high-temperature thin film formations, such a selective growth has not been possible since there have been no materials usable for such masking. However, according to this preferable embodiment, it is possible to carry out a patterning for forming devices using a silicon carbide, in which a selective etching is difficult.

In addition, by cleaning a growth surface of a crystal prior to the growth of a silicon carbide crystal so that the growth surface becomes a √3×√3 surface reconstruction structure, a silicon carbide thin film with an excellent crystallinity is achieved. Specifically, it is preferable that the cleaning be carried out, for example, by heating the growth surface at a temperature of 800° C. to 1300° C. in a hydrogen atmosphere or vacuum. If the temperature of the cleaning is lower than 800° C., the effect of the cleaning is insufficient since the impurities on the surface such as oxide film and the like are not completely removed. On the other hand, if the temperature is over 1300° C., silicon atoms are evaporated from the vicinity of the growth surface and therefore carbonization of the surface may be induced.

Now, the description explains a stacking of silicon carbide crystals each having a different crystal system from each other. Such stacking can be carried out by a method in which a second silicon carbide crystal having a different crystal system from a substrate formed of a first silicon carbide crystal is grown by controlling a temperature of the substrate, and by a method in which silicon carbide crystals are grown by a step-flow growth with the use of an off-cut substrate having regions composed respectively of a first silicon carbide crystal and a second silicon carbide crystal each with a crystal system different from each other.

The method by controlling a temperature of the substrate is based on the finding that a crystal system of growing silicon carbide can be controlled by changing a temperature of the substrate. In other words, this method makes use of the findings that, in a crystal growth using an off-cut substrate, when a temperature of the substrate is a little lower than the lowest temperature in which a perfect step-flow growth takes place, a crystal system that is stable at the temperature grows under a weak influence of a step on the surface of the substrate. That is to say, the silicon atoms or carbon atoms supplied on a terrace condense on the surface of the terrace and form a microcrystal before they diffuse on the surface of the terrace and reach a step. This microcrystal is not affected by the terrace and results in one with a most stable crystal system determined by the temperature of the surface of the substrate. As this microcrystal grows, the microcrystal encounters a step before it becomes a large stable crystal, then further grows under the influence of the step, and results in a large stable crystal. Therefore, this crystal does not reflect the crystal system of the substrate in the growth, as seen in the case of a perfect step-flow growth.

In accordance with this, for example, when such a crystal growth is developed using a 4° off-cut substrate of a {0001} face of a 6H hexagonal silicon carbide under the temperature of the surface of the substrate being kept at 900° C., a 3C cubic silicon carbide thin film is grown as the result. In this case, as previously described, when the off-cut direction was inclined towards the <1$\bar{1}$00> direction, a 3C cubic silicon carbide thin film having a good crystallinity and containing no twin was obtained. This direction provides the most suitable terrace and step edge for the above-described step-flow growth. As another example, when such a crystal growth is developed using a 1° off-cut substrate of a {0001} face of a 4H hexagonal silicon carbide under the condition that the temperature of the surface of the substrate is kept at 1500° C., a 6H cubic silicon carbide thin film is grown as the result. In such a case of a crystal growth of a hexagonal silicon carbide, the direction of the inclination of the off-cut may be the <11$\bar{2}$0> direction. It is noted here that when a temperature of the substrate is increased, more surface diffusion occurs, and therefore a width of a step should be made wider (an off-cut angle should be smaller) in order to grow a silicon carbide with a different crystal system. In the cases where a crystal growth is developed under a condition of silicon atoms being present in excess as previously described, a thin film with a good crystallinity was obtained when the temperature of the growth surface of a silicon carbide crystal is within the range of 600° C. to 1800° C. If the temperature is lower than 600° C., a good crystal growth does not take place since the surface diffusion becomes insufficient even with the silicon atoms bonded with the substrate by Si—Si bond. If the temperature is higher than 1800° C., a sublimation of silicon carbide from the growth surface becomes conspicuous, and the control of growing conditions becomes difficult. A growth of a silicon carbide having a different crystal system from a substrate having a good crystallinity can be achieved only through a growth under a low temperature as specified by the present invention.

The other method, the method in which silicon carbide crystals are grown by a step-flow growth with the use of an off-cut substrate (pretreatment substrate) having regions composed of a first silicon carbide crystal and a second silicon carbide crystal each with a different crystal system from each other, makes use of the finding that a silicon carbide crystal growing from a step in the upstream region of the step-flow growth direction is grown with the crystal proceeding on a terrace in the downstream region. More specifically, a perfect step-flow growth is developed using a substrate on which the first and the second silicon carbide crystals each with a different crystal system are formed in advance, and, thereby, a silicon carbide crystal having the same crystal system as the one formed in the upstream region is grown with the crystal proceeding on a silicon carbide crystal of the crystal system in the downstream region, and stacked thereon. In this case, the crystal growth proceeds with the interface between the silicon carbide crystals each with a different crystal system being maintained under a very good condition.

The pretreatment substrate as mentioned above can be readily formed by having silicon atoms present in excess, and growing a silicon carbide crystal having a different crystal system from the crystal system of the substrate formed of a first silicon carbide crystal selectively in a partial region on the surface of the substrate at a low temperature using a silicon oxide thin film and the like as a mask. The pretreatment substrate can also be formed by growing a second silicon carbide crystal having a different crystal system from a crystal system of a substrate on a surface of the silicon carbide substrate formed of a first silicon carbide crystal having a crystal face inclined with respect to the surface, and thereafter partially removing the grown silicon carbide by etching so as to expose a part of the substrate, as well as by using the above selective growth.

According to these methods, it is possible to grow and stack silicon carbide thin films being in contact with each other with a good interface, and to readily form layered structures having various combinations, sandwiched structures, layered structures with more layers, and the like.

Now the methods are explained in detail. Firstly, for example, there is formed a pretreatment substrate in which a 3C cubic silicon carbide is selectively grown on at least a part of the surface of the substrate having a {0001} face of a hexagonal silicon carbide such as 6H and 4H inclined with respect to the surface. When this pretreatment substrate is grown utilizing a step-flow growth by a normal CVD growing, it is possible to form a layered structure in which a {111} face of a 3C cubic silicon carbide is stacked on a {0001} face of a hexagonal silicon carbide such as 6H and 4H, or a layered structure in which a {0001} face of a hexagonal silicon carbide such as 6H and 4H is stacked on a {111} face of a 3C cubic silicon carbide.

For another example, by slightly increasing a temperature of the substrate in forming the pretreatment substrate, a 6H hexagonal silicon carbide is selectively grown on at least a part of the surface of the substrate having a {0001} face of a 4H hexagonal silicon carbide inclined with respect to the surface. When this pretreatment substrate is grown utilizing a normal step-flow growth, it is possible to form a layered structure in which a {0001} face of a 4H hexagonal silicon carbide is stacked on a {0001} face of a 6H hexagonal silicon carbide, or a layered structure in which a {0001} face of a 6H hexagonal silicon carbide is stacked on a {0001} face of a 4H hexagonal silicon carbide.

As another example, depending upon a pattern of the regions of different crystal systems in the pretreatment substrate, it is possible to produce such a layered structure including a 3C cubic silicon carbide crystal sandwiched between hexagonal silicon carbide crystals such as 4H and 6H, and a layered structure including a 6H hexagonal silicon carbide crystal sandwiched between 4H hexagonal silicon carbide crystals. More specifically, when a 3C cubic silicon carbide having a different crystal system from the substrate is formed in a central portion of a 6H hexagonal crystal substrate by a pretreatment, a stacked interface of 3C cubic crystal/6H hexagonal crystal and a stacked interface of 6H hexagonal crystal/3C cubic crystal are formed after the step-flow growth, and good interfaces are formed under a defect-free state as the growth proceeds. In this case, the growth of silicon carbide proceeds at the step edge, and the crystal system of the step edge determines the crystal system of the growing silicon carbide. In other words, since only the atomic alignment of the surface layer influences the crystal of the growing layer, the atomic alignment on the surface of the terrace does not regarding influence regarding the differences of the crystal systems such as hexagonal crystal and cubic crystals practically. Hence, the more the step-flow growth continues on the pretreatment substrate, the better the crystallinity of the interface of silicon carbides having a different crystal system and the crystallinity of silicon carbides per se become.

Even without using the above-described selective growth, such a silicon carbide substrate with a layered structure having different crystal systems as described above is possible according to the following manner. That is, a 3C cubic silicon carbide is grown, in the same manner as described above, on the whole surface of the substrate of a silicon carbide having a crystal face inclined with respect to the surface, for example a 6H hexagonal silicon carbide, and thereafter the grown 3C cubic silicon carbide is removed by etching so that it is partially left unremoved. Thus, a pretreatment substrate including a portion in which the 6H hexagonal crystal is exposed and a portion in which the 3C cubic crystal is left unremoved is formed, and finally the pretreatment substrate is subjected to the step-flow growth.

According to another aspect of the present invention, there is provided a silicon carbide substrate having a good crystallinity produced according to the above-described methods, and the substrate can exhibit the characteristics as set forth below. Specifically, a silicon carbide substrate in accordance with the present invention can have, for example, such a characteristic that a growth step edge present on a growth surface of silicon carbide is composed of a step edge selected from a [11$\bar{2}$0] step edge of a hexagonal silicon carbide, and a [110] step edge of a cubic silicon carbide. In addition, for example, a substrate of the present invention can have such a characteristic that nitrogen atoms of $5 \times 10^{18}/cm^3$ or more, and further $10^{19}/cm^3$ to $5 \times 10^{19}/cm^3$ or higher are contained in substitutional sites. Furthermore, a substrate of the present invention can have such a characteristic that the silicon carbide substrate may be formed on a surface of a substrate of hexagonal silicon carbide and composed of a single crystal of a cubic silicon carbide including a defect-free surface portion of 1 mm square or larger. Further, a substrate of the present invention can have such a characteristic that the substrate may be epitaxially grown selectively on a part of a silicon carbide substrate. Having such characteristics, the silicon carbide substrate of the present invention is widely applicable as a substrate for semiconductor devices utilizing characteristics intrinsic to silicon carbide such as an excellent thermal conductivity, dielectric strength, large band gap and the like.

According to a further aspect of the present invention, there is also provided a semiconductor device capable of high-speed operation by forming the semiconductor device using a silicon carbide substrate in which single layer silicon carbide crystals, each having a good crystallinity with a different crystal system from each other are stacked with an interface of an abrupt crystal structure therebetween. Specifically, in the case where different types of silicon carbide crystals, each with a different crystal structure are in contact with each other on a clean hetero-interface, conduction electrons are put into a low energy side of the conduction band in the hetero-interface, and a two-dimensional electron gas is formed. Therefore, electronic devices such as a HFET and the like are achieved by making use of a high carrier mobility of this electron gas.

More specifically, for example, when a HFET is formed using a layered structure of a 6H hexagonal silicon carbide having a wide band gap of 2.86 eV and a 3C cubic silicon carbide having a narrow band gap of 2.3 eV, carriers flow from the 6H hexagonal silicon carbide with a high doping concentration into a channel layer of the 3C cubic silicon carbide with a low doping concentration, and thereby a two-dimensional electron gas is formed in the 6H/3C interface. This two-dimensional electron gas shows a high carrier mobility, and the high speed operation is therefore achieved.

Such a two-dimensional electron gas can be formed not only in the 6H/3C interface, but also in such interfaces as a 4H/3C interface and 4H/6H interface, insofar as the interface is an interface of silicon carbides, each having a different crystal system and band gap.

In such hetero-interfaces of silicon carbides with a different crystal system, because only the way of stacking in the silicon carbide bilayer is different and the structure and composition of the silicon carbide bilayer is not changed, a lattice mismatch and the like are theoretically very small. Therefore, such hetero-interfaces can be superior to other interfaces having mixed crystal systems of gallium arsenide (GaAs) and the like, and thus a semiconductor device with more desirable characteristics can be achieved.

BEST MODE FOR CARRYING OUT THE INVENTION

Now, the present invention is detailed on the basis of the examples set forth below.

EXAMPLE 1

As Example 1 of the present invention, there is explained below an example of developing a crystal growth of a hexagonal silicon carbide grown on a silicon face (Si face) of a hexagonal silicon carbide.

Figure 4:
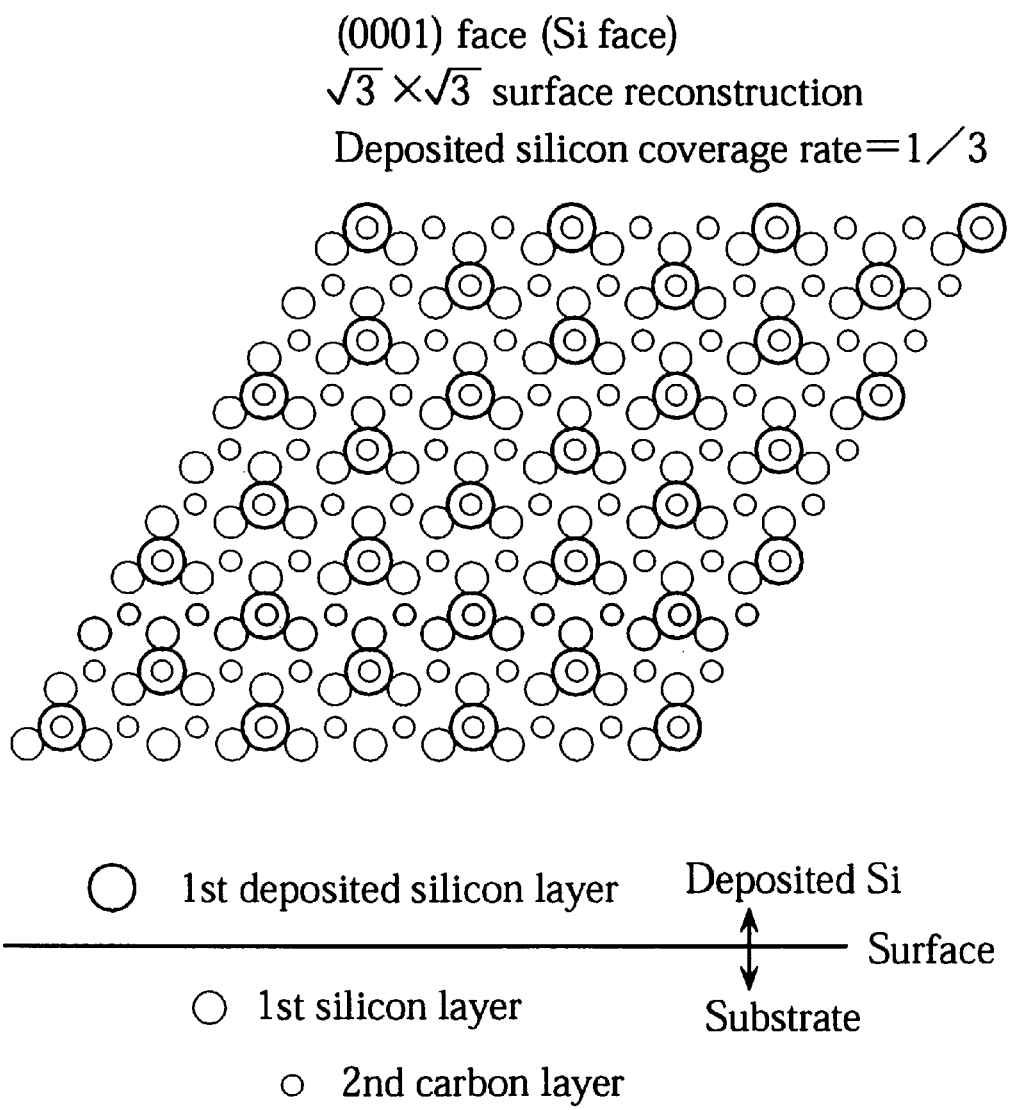
FIG. 4 is a diagram showing a √3×√3 surface reconstruction state of a (0001) face (Si face) of a hexagonal silicon carbide.

Firstly, a substrate made of a single crystal of 6H hexagonal silicon carbide having a surface 3.5° off-cut towards the <11$\bar{2}$0> direction of a (0001) face (Si face) was introduced to a molecular beam epitaxy (MBE) apparatus, and heated at 1100° C. with a background pressure of $10^{-9}$ or less. The substrate was thus cleaned. It was confirmed from the result of a reflection high-energy electron diffraction (RHEED) that the substrate retains a surface reconstruction structure of √3×√3 as illustrated in FIG. 4.

Figure 1:
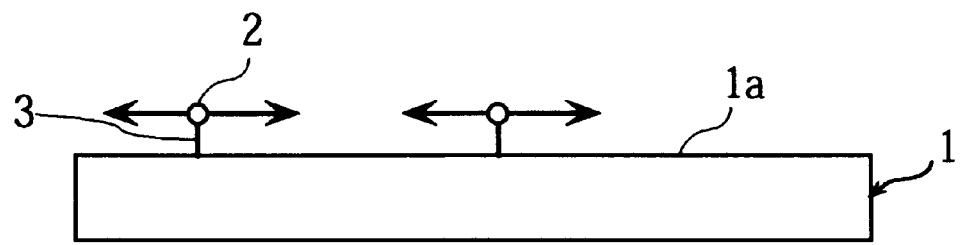
FIG. 1 is a diagram schematically showing an example of a producing method in accordance with the present invention.
Figure 2:
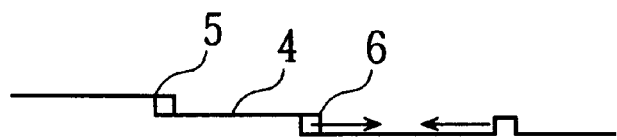
FIG. 2 is a diagram schematically showing a growth of a silicon carbide crystal on an off-cut surface in an example of a producing method in accordance with the present invention.
Figure 3A:
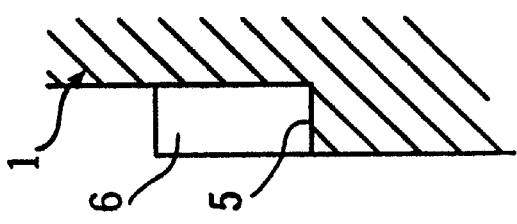
FIG. 3(a) to 3(b) are diagrams schematically showing a growth of a silicon carbide crystal on an off-cut surface in an example of a producing method in accordance with the present invention.
Figure 3A:
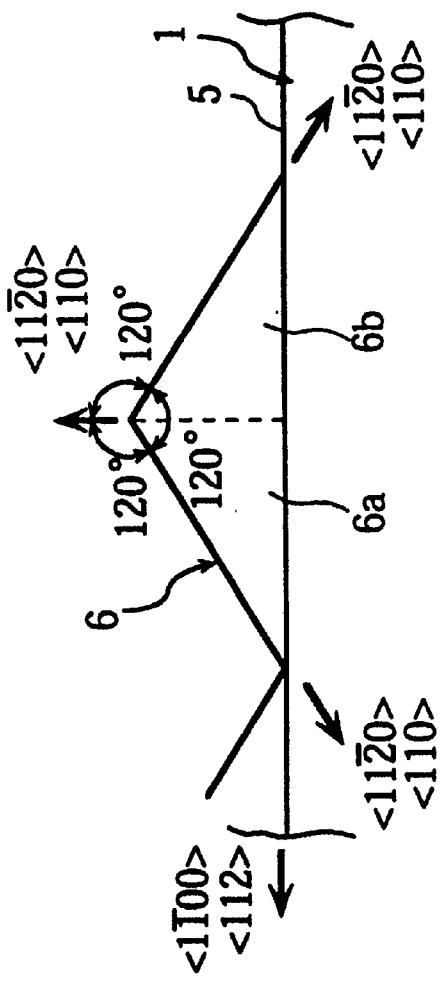
Figure 3B:
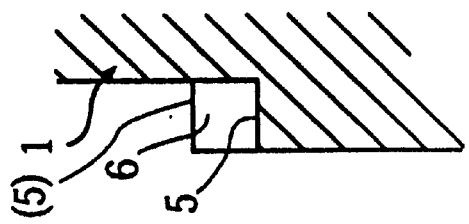
Figure 3B:
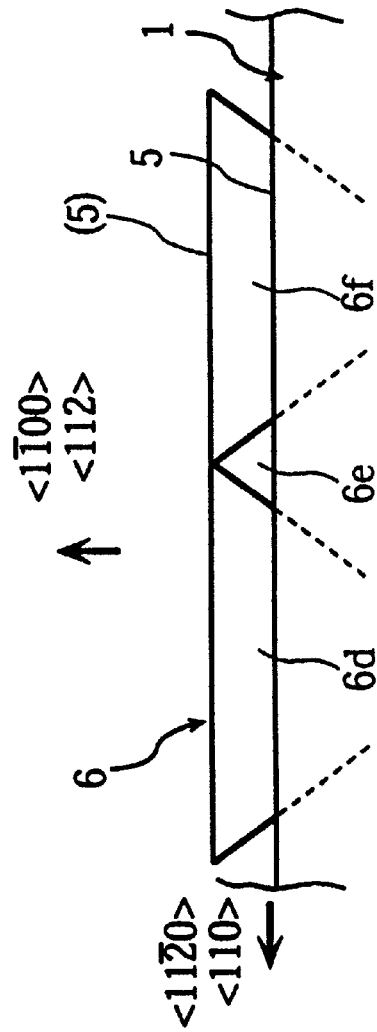

Secondly, silicon atoms were supplied from k-cell heated at 1380° C. under the condition where the temperature of the substrate was being kept at 1100° C., and carbon atoms were supplied from an electron beam evaporation device with a power of 8 kV and 100 mA. More specifically, by supplying silicon atoms for ⅓ atomic layer, the above-mentioned surface reconstruction structure of √3×√3 was more conspicuously observed. This indicates, as shown in FIG. 4, that excessive silicon atoms of the number of the atoms corresponding to ⅓ atomic layer are deposited on a terrace. Under this condition, when approximately the same number of carbon atoms as that of the silicon atoms is supplied on the surface of the substrate, a RHEED reflection streak that shows the √3×√3 surface reconstruction structure is weakened, and it becomes close to a 1×1 pattern. This demonstrates that, as shown in FIG. 2, the silicon atoms deposited on the terrace and the carbon atoms that are subsequently supplied are collected and crystallized in the vicinity of a step edge 5, and hence a step-flow growth 6 is developed, and a surface of a terrace 4 obtains a surface reconstruction structure that is close to the 1×1 pattern. In this case, the length of the step-flow growth results in a length corresponding to the number of atoms of ⅔ atomic layers. More specifically, assuming that the height of the step corresponds to 2 atomic layers (a silicon layer and a carbon layer), the length of the step-flow growth results in ⅓ length of the terrace.

Following the above, the supplying of the silicon atoms and the supplying of the carbon atoms are repeated, and thereby a hexagonal silicon carbide epitaxial thin film having a good crystallinity and a smooth and flat surface is formed with the surface reconstruction structure being alternately changed between √3×√3 and 1×1.

Figure 5:
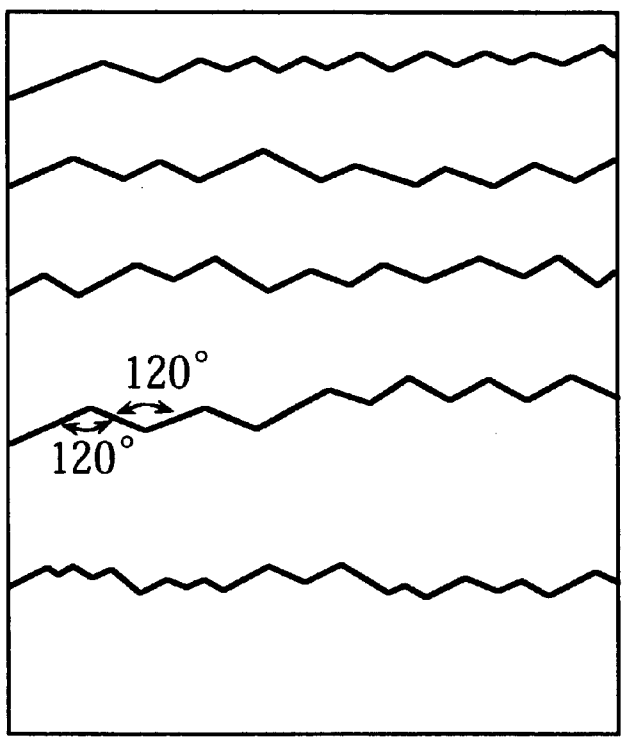
FIG. 5 is a schematic representation of an SEM photograph showing an example of a surface of a silicon carbide thin film in accordance with the present invention.

The growth surface of the silicon carbide thin film thus formed was observed by SEM photography. As a consequence, it was confirmed that the crystal growth occurred in such a way that the step edges 5 of the [11$\bar{2}$0] direction intersecting each other with an angle of 120° proceed, as schematically shown in FIG. 5.

As has been described above, a silicon carbide thin film with a good crystallinity can be formed at a relatively low temperature by supplying silicon atoms and carbon atoms so that the silicon atoms are slightly in excess of the carbon atoms.

It is noted that in the case where an off-cut face inclined towards the <11$\bar{2}$0> direction is employed as the original silicon carbide substrate, it is possible that, as the crystal growth proceeds, a step bunching, in which a plurality of growing steps are overlapped, becomes conspicuous and thereby the roughness of the growth surface is increased. In consideration of this, in the cases where the resulting substrate is subjected to a micromachining and the like, in which such roughness is likely to cause problems, it is preferable that an off-cut surface inclined towards the <1$\bar{1}$00> direction be employed. When such an off-cut surface is employed, a good crystallinity can be obtained at a relatively low temperature as well as in the above-described case, and moreover, a flatness of the growth surface is increased since the step bunching does not easily take place.

In the case where a 4H hexagonal silicon carbide substrate was employed as the original silicon carbide substrate, the same crystal growth took place. It is noted that, in the case of the 4H hexagonal silicon carbide substrate, if the temperature of the substrate is kept at a relatively high temperature (for example, at 1600° C. in the case of the off-cut angle being 1°), the same 4H crystal structure as in the original silicon carbide substrate is formed. (A homoepitaxial growth) By contrast, if the temperature is kept at a lower temperature (for example, at 1500° C. in the case of the off-cut angle being 1°), 6H crystal structure is formed regardless of the crystal structure of the original silicon carbide substrate. (A heteroepitaxial growth)

Regarding a heating temperature of the substrate, it may be determined depending upon crystal structures to be formed. However, when the temperature is 600° C. or higher, a crystal growth with a good crystallinity can be easily carried out since the degree of diffusion of silicon atoms is relatively large. In addition, when the temperature is 1300° C. or lower, a crystal growth in a selective region by utilizing masking or a nitrogen doping with a high concentration, as will be shown later in Examples 4 and 5, can be readily carried out. Even if the temperature exceeds 1300° C., the effect of forming a silicon carbide crystal with a good crystallinity is obtained as well. In summary, in the case where the substrate is heated at the same temperature as in conventional methods, a silicon carbide crystal with a better crystallinity can be formed, while in the case where the same crystallinity as in conventional methods is required, the temperature can be made lower.

Regarding the supply control of silicon atoms and carbon atoms, if silicon atoms continue to be supplied in a large amount after the surface reconstruction structure becomes $\sqrt{3}\times\sqrt{3}$ and thereby the number of excessive silicon atoms exceeds the number of silicon atoms corresponding to approximately 5 atomic layers in a hexagonal silicon carbide crystal, crystal grains (droplets) of silicon tend to be formed. In contrast, if carbon atoms continue to be supplied in a large amount after the surface reconstruction structure becomes 1×1, carbon atoms with a low diffusion characteristic are likely to be deposited on the terraces. In both cases, an appropriate stepflow growth is hampered. However, the response in the supply control of silicon atoms does not require a high precision, and even if the surface reconstruction structure becomes a state of $\sqrt{3}\times\sqrt{3}$ or 1×1, an appropriate step-flow growth can take place when the supply control as described above is carried out within, for example, several minutes. In addition, the supply control may be carried out in order that a certain surface reconstruction structure or a certain range of the reconstruction structure is achieved between $\sqrt{3}\times\sqrt{3}$ and 1×1, and it does not need to be carried out in order that the surface reconstruction structure changes throughout the range of from $\sqrt{3}\times\sqrt{3}$ to 1×1.

Furthermore, the supply of silicon atoms and carbon atoms is not limited to the above-described method in which silicon atoms and carbon atoms are alternately supplied, but it may be carried out so that either of silicon atoms or carbon atoms is consecutively supplied and the other is intermittently supplied. Of these, the control in the case of carbon atoms being intermittently supplied is comparatively easier. Additionally, it is possible that both are consecutively supplied, if the control is so carried out that a state of silicon atoms being slightly in excess is maintained.

In this example, there has been shown an example in which a reflection high-energy electron diffraction (RHEED) is used for detecting a surface reconstruction structure in the supply control of silicon atoms and carbon atom. However, an existence ratio of silicon atoms and carbon atoms can be controlled by measuring a composition ratio on the surface of the substrate using Auger electron spectroscopy or ESCA analysis. Alternatively, the amounts of silicon atoms and carbon atoms to be supplied and the supplying pattern thereof may be predetermined by carrying out the detection of a surface reconstruction structure in advance, and thereby such a detection as described above may be eliminated in the manufacturing stages.

As for an off-cut angle (tilt angle) of the original silicon carbide substrate, it is not limited to 3.5° as described above, and a good crystallization using the step-flow growth can be readily carried out when the angle is in the range of approximately 0.05° to 10°.

In this example, a molecular beam epitaxy (MBE) apparatus was used for the crystal growth. However, the present invention is not limited thereto, and a CVD apparatus or the like may be used.

In addition, the supply sources of silicon atoms and carbon atoms are not limited to the above-mentioned ones either, and for example, such other supply source gases as silane, propane, acetylene and the like may also be employed.

EXAMPLE 2

As Example 2 of the present invention, there is explained an example of a crystal growth of a hexagonal silicon carbide grown on a carbon face (C face) of a hexagonal silicon carbide.

The substrate employed for this Example 2 is a single crystal substrate of a 6H or 4H hexagonal single crystal silicon carbide that has an 3.5° off-cut surface towards a <11$\bar{2}$0> direction of a (000$\bar{1}$) face (C face). This substrate was, as in Example 1, introduced into a molecular beam epitaxy (MBE) apparatus, and cleaned. In this case, a certain surface reconstruction structure was not observed. This is considered to be due to the fact that there is no particular stable and clean surface reconstruction structure in the case of the (000$\bar{1}$) face (C face).

Figure 6:
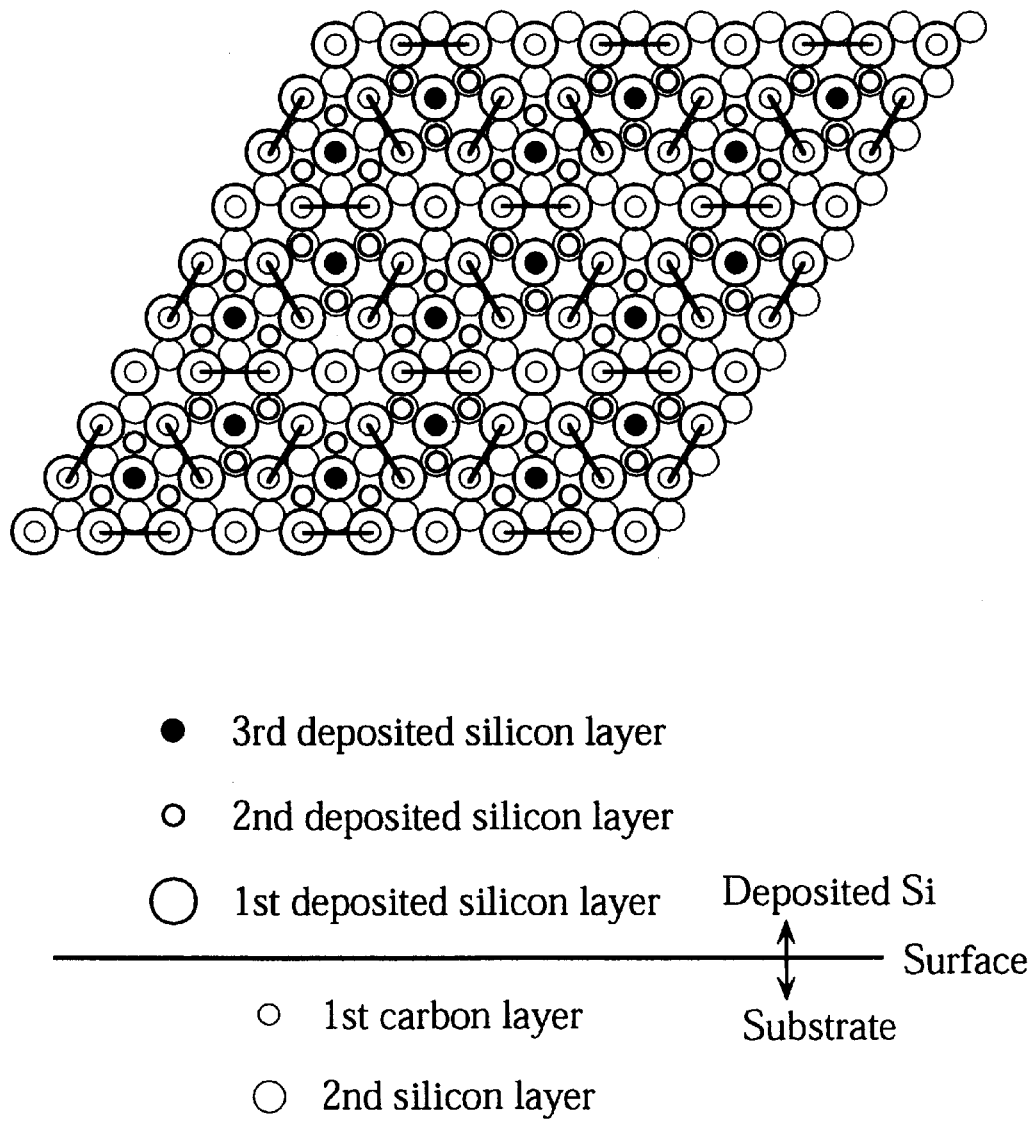
FIG. 6 is a diagram illustrating a 3×3 surface reconstruction state of a (000$\bar{1}$) face (C face) of a hexagonal silicon carbide.

When silicon and carbon are supplied one by one in the same manner as in the above Example 1, firstly, a state of a 3×3 surface reconstruction structure as shown in FIG. 6 is obtained at the point when silicon atoms for 17/9 atomic layers have been supplied on the surface of the substrate. When approximately the same number of carbon atoms as that of the silicon atoms are supplied, a RHEED reflection streak showing the 3×3 surface reconstruction structure is weakened and becomes close to a 1×1 pattern, and a step-flow growth of hexagonal silicon carbide that corresponds to the number of atoms of approximately 4 atomic layers takes place.

Following the above, the supply of silicon atoms and the supply of carbon atoms are repeated, and thereby a hexagonal silicon carbide epitaxial thin film having a good crystallinity and a smooth and flat surface is obtained while the surface reconstruction structure is alternately being changed between 3×3 and 1×1.

As has been described, also in the case of a crystal growth of hexagonal silicon carbide on a C face of hexagonal silicon carbide, a silicon carbide thin film with a good crystallinity can be produced at a relatively low temperature by supplying silicon atoms and carbon atoms so that the silicon atoms are slightly in excess of the carbon atoms, although the supply control of silicon atoms and carbon atoms is different from the above Example 1.

It is to be noted that various modifications such as explained in the above Example 1 are also possible in this Example 2.

EXAMPLE 3

As Example 3 of the present invention, there is explained an example of a crystal growth of a cubic silicon carbide grown on a silicon face (Si face) of a hexagonal silicon carbide.

The substrate employed for this Example 3 is a single crystal substrate of a 6H or 4H hexagonal single crystal silicon carbide that has an 3.5° off-cut surface towards a <1$\overline{1}$00> direction of a (0001) face (Si face). This substrate was, as in Example 1, introduced into a molecular beam epitaxy (MBE) apparatus, heated at 1100° C., and cleaned. It was confirmed from the result of a reflection high-energy electron diffraction (RHEED) that the substrate retains a surface reconstruction structure of √3×√3 (FIG. 4), as in Example 1.

Figure 7:
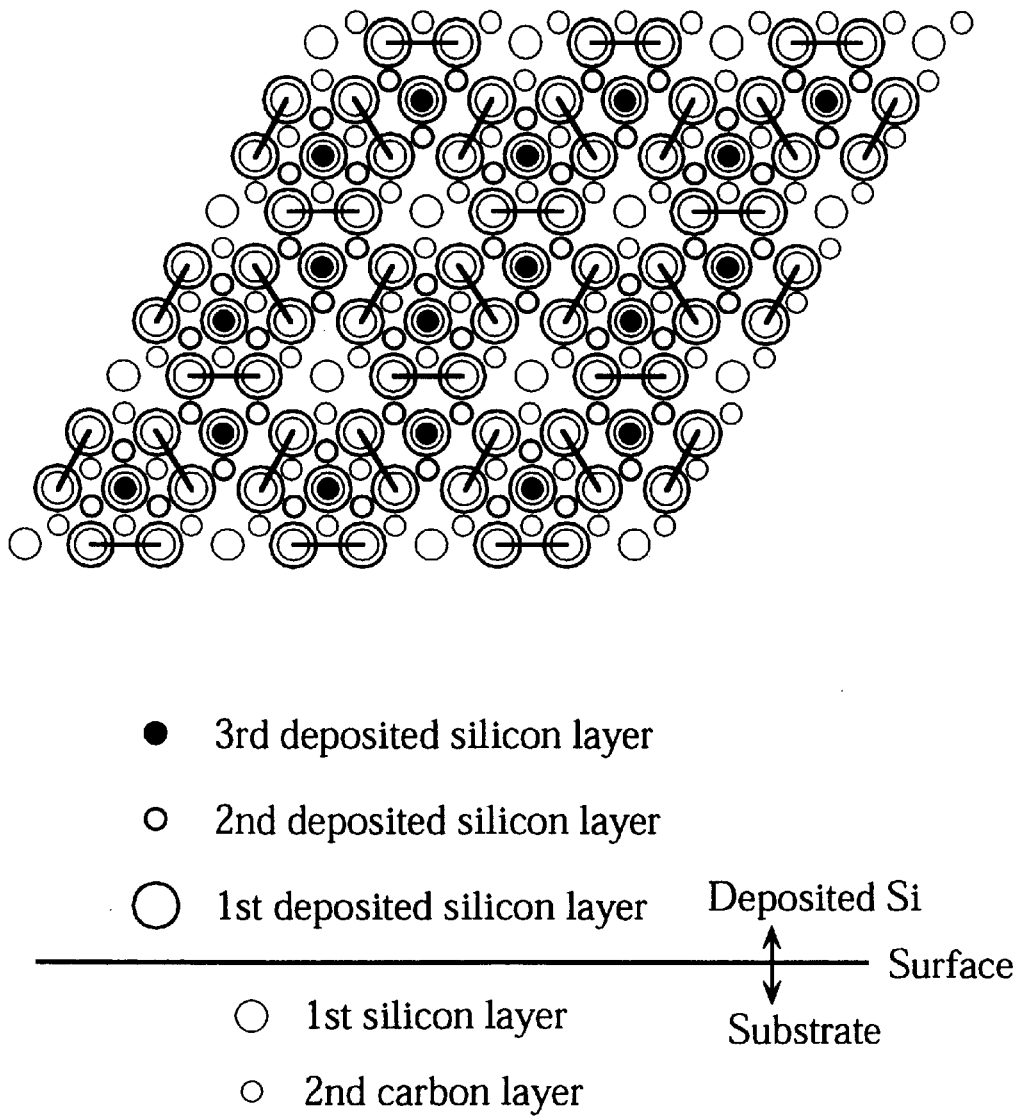
FIG. 7 is a diagram illustrating a 3×3 surface reconstruction state of a (0001) face (Si face) of a hexagonal silicon carbide.

Subsequently, a crystal is grown in the same manner as in Example 1 except that a different temperature of the substrate and a different supplied amount of silicon and carbon are employed. More specifically, silicon is at first supplied after the temperature of the substrate is lowered and kept at 900° C. As in Example 1, the √3×√3 surface reconstruction structure is more conspicuously observed by supplying silicon atoms for ⅓ atomic layer. However, when the supply of silicon is further continued, a 3×3 surface reconstruction structure in which excessive silicon atoms with the number of atoms corresponding to 16/9 atomic layers are deposited on the terraces is obtained, as shown in FIG. 7. When approximately the same number of carbon atoms as that of the silicon atoms are supplied, a RHEED reflection streak that shows the 3×3 surface reconstruction structure is weakened, and it becomes close to the 1×1 pattern via the √3×√3 pattern. Thus, a step-flow growth of cubic silicon carbide (111) that corresponds to the number of atoms of approximately 4 atomic layers takes place.

It is understood that the reason for the growth of the cubic crystal, not the hexagonal crystal as in the above Examples 1 and 2, is that the temperature of the substrate is kept at 900° C. At such a relatively low temperature, the degree of the surface diffusion of silicon atoms deposited on the terrace 4 is low, and therefore, when carbon atoms are supplied, the crystallization of a cubic crystal relatively stable at such a temperature is likely to occur on the terrace 4. Accordingly, a perfect step-flow growth in which the crystallization occurs in the vicinity of the step edge 5 does not take place. Hence, as described above, a cubic silicon carbide can be heteroepitaxially grown on a hexagonal silicon carbide.

Following the above, the supply of the silicon atoms and the supply of the carbon atoms were repeated, and thereby a cubic silicon carbide epitaxial thin film having a good crystallinity and a smooth and flat surface was obtained while the surface reconstruction structure was alternately being changed among 3×3 and √3×√3 and 1×1.

As has been described above, by supplying silicon atoms and carbon atoms so that the silicon atoms slightly exceeds the carbon atoms, it is possible to carry out a crystallization of silicon carbide at a relatively low temperature and to obtain a cubic silicon carbide thin film with a good crystallinity. In particular, by utilizing a step-flow growth of a cubic silicon carbide grown on a hexagonal silicon carbide substrate having an off-cut surface in the <1$\overline{1}$00> direction of the (0001) face as described above, a crystal growth of a single phase cubic silicon carbide free from twin can be attained. More specifically, in the case, for example, where the cubic silicon carbide was grown to have a thickness of 20 μm, a heteroepitaxial thin film with a defect-free single crystal surface was obtained over an area of 1 mm square or larger.

It is to be noted that the same crystal growth was observed in both cases of a 6H hexagonal silicon carbide substrate and a 4H hexagonal silicon carbide substrate employed as the original silicon carbide substrate. In addition, a hexagonal silicon carbide substrate having a 3.5° and the like off-cut surface towards a <1$\overline{1}$00> direction of a (000$\overline{1}$) face (C face) may be employed. Further, a cubic silicon carbide substrate may be employed as the original silicon carbide substrate. In this case of the cubic silicon carbide substrate, a cubic silicon carbide thin film with a good crystallinity can be likewise formed by employing a cubic silicon carbide substrate having a (111) face (Si face) or an off-cut surface towards a <112> direction of a ($\overline{1}\overline{1}\overline{1}$) face (C face), which corresponds to the (0001) face or the off-cut surface towards the <1$\overline{1}$00> direction of the (000$\overline{1}$) face in the hexagonal silicon carbide. Also, in the cases where the (000$\overline{1}$) face (C face) of the hexagonal crystal is employed, and the (111) face (Si face) or the ($\overline{1}\overline{1}\overline{1}$) face (C face) of the cubic crystal is employed to crystallize a cubic silicon carbide, the surface reconstruction structure of 1×1 to 3×3 can be utilized as a guideline in controlling the supply of silicon atoms and carbon atoms. It is also noted that even in the case where an off-cut surface of the <11$\overline{2}$0> or <110> direction of hexagonal or cubic silicon carbide substrate is employed, it is possible to achieve such an effect that the crystallization can be easily attained at a relatively low temperature, although twin tends to occur in the resulting cubic silicon carbide crystal.

It is noted that various modifications such as explained in Example 1 are also possible in this Example 3, as well as the above-described variations.

EXAMPLE 4

In this Example 4, in carrying out a crystal growth of hexagonal or cubic silicon carbide in the same manner as in the above Examples 1 to 3, ammonia gas was supplied with a pressure of approximately $2\times10^{-8}$ Torr. Thereby, it was made possible to form a silicon carbide crystal thin film that contains in substitutional sites at least $5\times10^{18}/cm^3$ of nitrogen, or at least $10^{19}/cm^3$ or at least $5\times10^{19}/cm^3$ depending upon the conditions such as temperatures of the substrate, and has a good crystallinity and no surface roughness. This example demonstrates that, by supplying silicon atoms and carbon atoms in such a way that silicon atoms are present in excess of carbon atoms, the crystal can be grown while the temperature of the substrate is kept at a low temperature as described above, and therefore, nitrogen atoms are efficiently introduced to substitutional sites of the silicon carbide crystal, enabling one to readily carry out a high density doping.

EXAMPLE 5

Figure 8:
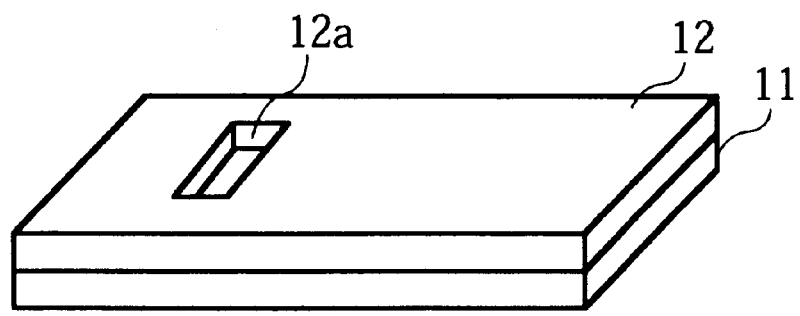
FIG. 8 is a perspective view for illustrating a selective growing of a silicon carbide thin film in an example of a producing method in accordance with the present invention.

Prior to a crystal growth of silicon carbide, a mask pattern composed of a silicon oxide film 12 having an aperture 12a formed on a surface of a hexagonal silicon carbide substrate 11 was prepared. FIG. 8. More specifically, the silicon oxide film 12 with a thickness of for example 50 nm was formed on a surface of for example the hexagonal silicon carbide substrate 11 by sputtering; then a patterning was carried out by a photo lithography utilizing a buffer fluoric acid etching, and thus the aperture 12a was formed.

The hexagonal silicon carbide substrate 11 was introduced into a CVD growing chamber, and a silicon carbide crystal was heteroepitaxially grown while the supply of silicon atoms and carbon atoms was being controlled so that silicon atoms are slightly in excess of carbon atoms, as in the cases of the above Examples 1 to 3, in which the molecular beam epitaxy apparatus is used. Thereby, a silicon carbide thin film having a good crystallinity and a flat and smooth surface can be selectively formed only in a region of the aperture 12a. Accordingly, a crystal of silicon carbide can be easily grown only in a desired region, since the temperature of the substrate can be maintained at a low temperature as above and thereby the silicon oxide film 12 is not damaged.

The material for the mask pattern is not limited to the above silicon oxide film. Various well-known materials for masking may be used since the temperature of the substrate can be maintained at a low temperature.

In addition, this example is not limited to the use of the CVD apparatus, and such a masking as described above may also be carried out in the cases of the molecular beam epitaxy apparatus as in Examples 1 to 3.

EXAMPLE 6

Now there is explained an example of producing a silicon carbide substrate in which a hexagonal silicon carbide crystal and a cubic silicon carbide crystal are stacked together. According to this example, a layered structure in which a cubic silicon carbide crystal layer is disposed between hexagonal silicon carbide crystal layers.

Figure 9:
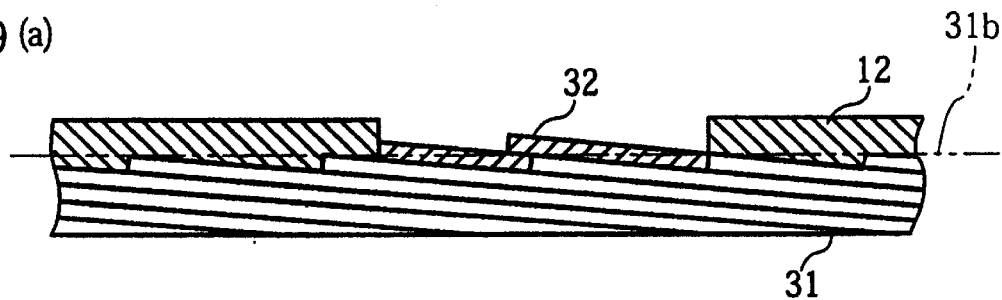
FIGS. 9(a) to 9(c) are diagrams showing producing steps of a silicon carbide substrate in accordance with Example 6.
Figure 9:
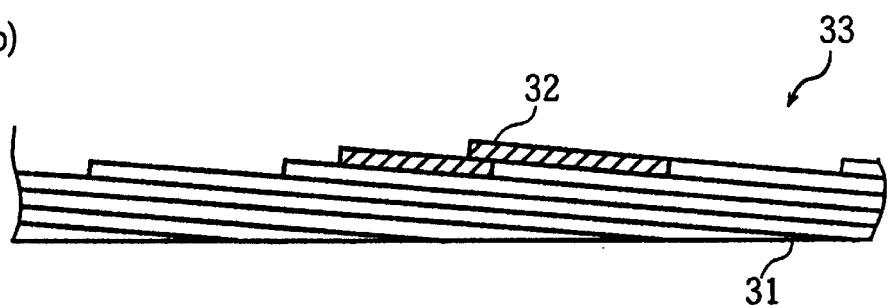
Figure 9:
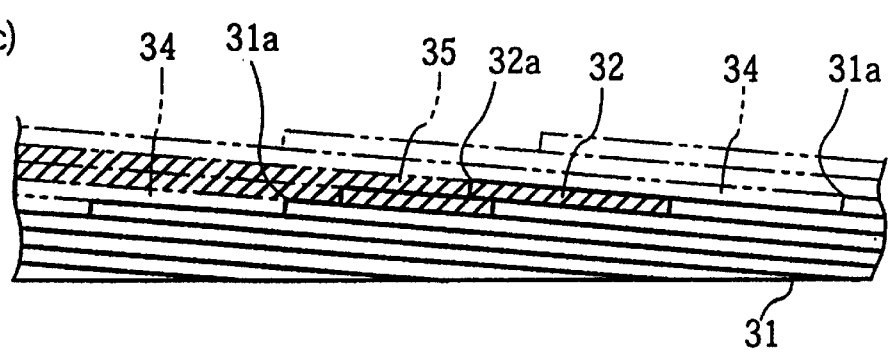

Firstly, as shown in FIG. 9(a), a cubic silicon carbide crystal 32 (second silicon carbide crystal) is partially formed on a 6H or 4H hexagonal silicon carbide crystal 31 (said first silicon carbide crystal) having a off-cut surface 31b 4° off-cut towards a <1$\bar{1}$00> direction of a {0001} face, utilizing a mask pattern, a silicon oxide film 12, as in the above Example 5. Secondly, as shown in FIG. 9(b), the silicon oxide film 12 is removed by a buffer fluoric acid treatment, and a pretreatment substrate 33 is thus formed.

The pretreatment substrate 33 is introduced into a CVD growing chamber, and a normal step-flow growth is developed. More specifically, the crystal growth is developed under the CVD conditions where, for example, a pressure is atmospheric pressure, the temperature of the substrate is 1600° C., hydrogen as a carrier gas is 2 slm, silane is 1 sccm, and propane is 1 sccm.

Accordingly, as shown in FIG. 9(c), a hexagonal silicon carbide crystal 34 (first silica carbide crystal) and a cubic silicon carbide crystal (second silicon carbide crystals) with a film thickness of approximately 3 µm are grown by utilizing a step-flow growth in, for example, 1 hour. In this case, because of a relatively high substrate temperature, the same crystal structure as the original crystal structure is obtained in each of the step edges 31a and 32a by the step-flow growth. In other words, on the one hand, a hexagonal silicon carbide crystal 34 is grown from the step edge 31a of hexagonal crystal, and on the other hand a cubic silicon carbide crystal 35 is grown from the step edge 32a of the cubic crystal. In each case, the crystallization proceeds towards a direction of the inclined interfaces. As a result, a layered structure in which the cubic silicon carbide crystal 35 is disposed between the hexagonal silicon carbide crystals 34 is thus formed. It was confirmed that the interface between the hexagonal silicon carbide crystal 34 and the cubic silicon carbide crystal 35 thus formed has an abrupt interface with a defect-free and perfect crystallinity.

As has been described above, by a step-flow growth using an off-cut substrate having pre-formed regions of a cubic silicon carbide crystal and of a hexagonal silicon carbide crystal, it is easily possible to grow a hexagonal silicon carbide crystal on a cubic silicon carbide crystal, to grow a cubic silicon carbide crystal on a hexagonal silicon carbide crystal, and to grow each of them alternately.

It is noted that the formation of such a layered structure is also possible in the case where either of 6H or 4H hexagonal silicon carbide substrate is used as the original hexagonal silicon carbide substrate to form the above pretreatment substrate.

Regarding the off-cut angle (tilt angle) of the original silicon carbide substrate, it is not limited to 4° as described above, and such a layered structure as above can be easily formed when the angle is in the range of approximately 0.05° to 10°.

Regarding the formation of the pretreatment substrate and the step-flow growth in the pretreatment substrate, both are not limited to the methods using the molecular beam epitaxy apparatus or the CVD apparatus, and the various well-known methods of crystal growth may be employed.

In addition, although the pretreatment substrate on which the single phase cubic silicon carbide crystal with no twin is formed can be easily formed according to the same manner as in the above Example 5, it is not limited thereto. However, it is preferred that regions having a good crystallinity each with a different crystal system from each other be formed on the substrate. In particular, when a pretreatment substrate in which a region of a different crystal system from the other region is formed at a temperature of the substrate being approximately 600° C. to 1800° C. is employed, a layered structure having an interface with a good crystallinity is readily formed.

EXAMPLE 7

Now, there is described another example of forming a silicon carbide substrate in which a hexagonal silicon carbide crystal and a cubic silicon carbide crystal are stacked together. According to this example, a layered structure in which a hexagonal silicon carbide crystal layer is disposed between cubic silicon carbide crystal layers is formed.

Figure 10:
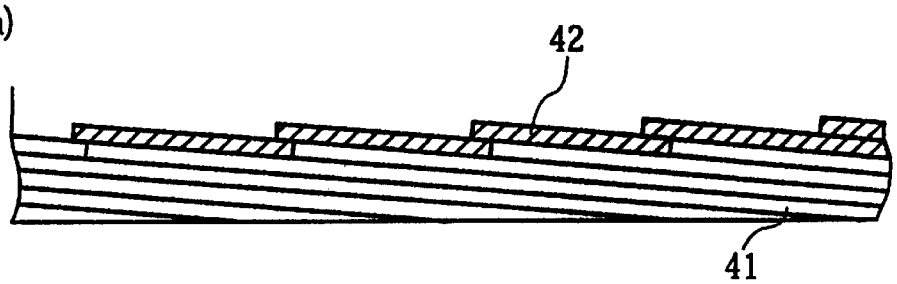
FIGS. 10(a) to 10(d) are diagrams showing producing steps of a silicon carbide substrate in accordance with Example 7.
Figure 10:
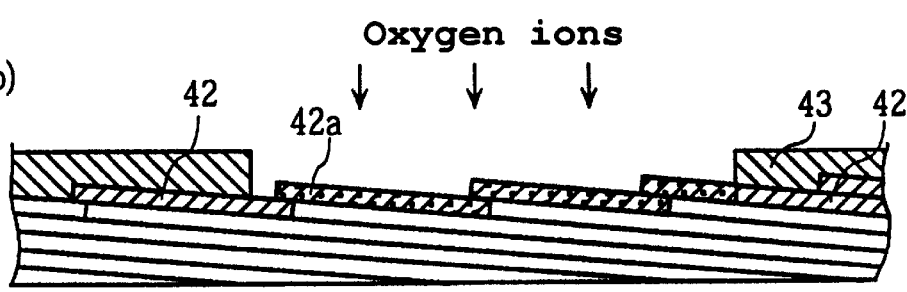
Figure 10:
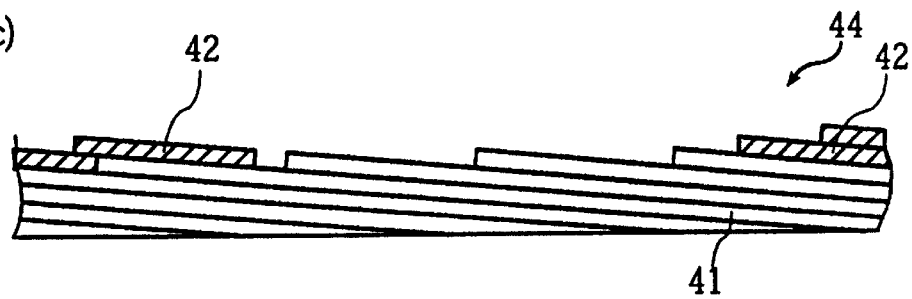
Figure 10:
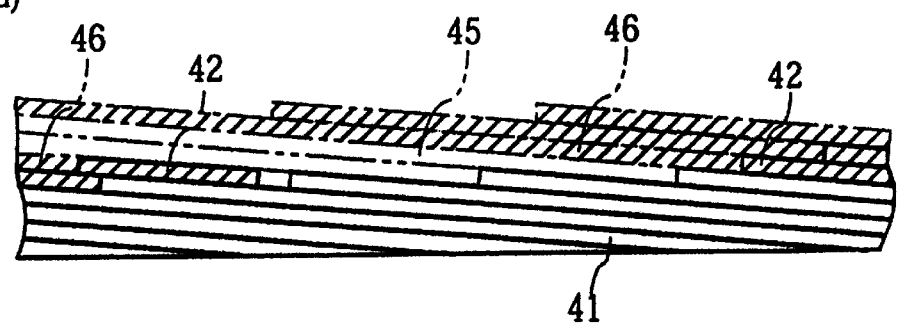

Firstly, according to the same manner as in the above Example 3, a cubic silicon carbide crystal 42 (second silicon carbide crystal) having a film thickness of for example 30 nm is grown over the whole surface of a hexagonal silicon carbide crystal 41 (first silicon carbide crystal) as shown in FIG. 10(*a*).

Secondly, using a mask pattern 43 composed of a metal mask, oxygen ions are implanted into only a predetermined region 42*a* in the cubic silicon carbide crystal 42 (second silicon carbide crystal) with an accelerating potential of 30 keV and a dosage of approximately $10^{16}$ cm$^{-2}$ as illustrated in FIG. 10(*b*). Then, a wet oxidation is carried out for 1 hour at 1100° C. in an oxygen atmosphere. A portion of the cubic silicon carbide crystal 42 in the region 42*a* is thereby made to be a complete oxide film.

Thereafter, by carrying out a buffered fluoric acid etching treatment, the portion of the region 42*a*, turned into the oxide film, is removed, and a pretreatment substrate 44 in which the hexagonal silicon carbide crystal 41 is exposed in a portion of the cubic silicon carbide crystal 42 is thus formed, as shown in FIG. 10(*c*).

Following this, as in Example 6, the pretreatment substrate 44 is introduced into a CVD growing chamber, and a crystal growth is developed. Thereby, a layered structure in which the hexagonal silicon carbide crystal 45 (first silicon carbide crystal) is disposed between the cubic silicon carbide crystals 46 (second silicon carbide crystal) is formed, as shown in FIG. 10(*d*).

EXAMPLE 8

Now, there is described an example of producing a silicon carbide substrate in which a 6H hexagonal silicon carbide crystal is disposed between 4H hexagonal silicon carbide crystals.

Firstly, a 4H hexagonal silicon carbide single crystal substrate having 1° off-cut surface towards a <1$\bar{1}$00> direction of a (0001) face (Si face) is masked by a graphite plate or a graphite sheet having a predetermined mask pattern, and introduced into a CVD growing chamber, and thus a step-flow growth is developed only in a partial region corresponding to the mask pattern. More specifically, a crystal 42 (second silicon carbide crystal) growth is developed for 10 minutes under the CVD conditions where, for example, a pressure is atmospheric pressure, the temperature of the substrate is 1500° C., hydrogen as a carrier gas is 2 slm, silane is 1 sccm, and propane is 1 sccm. A 6H hexagonal silicon carbide thin film (second silicon carbide crystal) with a film thickness of approximately 0.5 μm is thereby formed on a predetermined region on a surface of a 4H hexagonal silicon carbide substrate (first silicon carbide crystal), and the resulting substrate is employed as a pretreatment substrate. In this case, the original substrate is 4H silicon carbide, but a 6H silicon carbide crystal is grown since the temperature of the substrate is kept at 1500° C., and a width of terrace is relatively large (an off-cut angle is 1°). That is to say that, under the temperature of the substrate and the like conditions as described above, the degree of a surface diffusion of silicon atoms and carbon atoms on the surface of the terrace becomes insufficient, and therefore a perfect step-flow growth, in which a crystallization occurs in the vicinity of step edges, does not take place, but instead, a crystallization of 6H silicon carbide relatively stable at the above temperature tends to occur, resulting in a heteroepitaxial growth.

Following the above, the aforementioned pretreatment substrate is introduced into a CVD growing chamber, and a normal step-flow growth is developed. More specifically, a crystal growth is developed under the CVD conditions where, for example, a pressure is atmospheric pressure, the temperature of the substrate is 1600° C., hydrogen as a carrier gas is 2 slm, silane is 1 sccm, and propane is 1 sccm.

Thereby, a 4H and 6H hexagonal silicon carbide crystal with a film thickness of approximately 3 μm is grown by a step-flow growth in, for example, 1 hour. In this case, the temperature of the substrate is high, and therefore the step-flow growth with the same crystal structure as the original crystal structure takes place at each of the step edges. In other words, from the step edges of 4H or 6H, a 4H hexagonal silicon carbide crystal or a 6H hexagonal silicon carbide crystal is respectively grown, and a crystallization proceeds towards a direction of each inclined interface. Therefore, a layered structure in which a 6H hexagonal silicon carbide crystal is disposed between 4H hexagonal silicon carbide crystals is thus formed.

It is understood that, regarding the stacking silicon carbide crystal layers with a different crystal system from each other, the examples are not limited to the above Examples 6 to 8. It is readily possible to stack a plurality of silicon carbide crystal layers with various types of crystal systems by utilizing a step-flow growth employing off-cut substrates on which silicon carbide crystal regions having different crystal systems are formed in advance.

EXAMPLE 9

A silicon carbide crystal was grown to obtain a film thickness of 5 μm under the same CVD conditions as described in the above Example 8 except that the temperature of the substrate was 1600° C. and the employed substrate had an off-cut surface 3.5° inclined with respect to a {0001} face of the 6H hexagonal silicon carbide crystal towards a <1$\bar{1}$00> direction. As the result, little step bunching occurred, and the surface roughness resulted in 10 nm or smaller. In contrast, in the case of employing an off-cut direction of the <11$\bar{2}$0> direction under the same conditions, a surface roughness by step bunching of several ten nm or larger was observed after the film thickness reached 5 μm. In both cases, the crystallinity of the resulting silicon carbide crystal was good.

It is understood from the above that, in the cases where the increase of a surface roughness by step bunching causes problems, for example, in such a case that the substrate is subjected to a micromachining and the like, the problems can be avoided by employing an off-cut direction of the <1$\bar{1}$00> direction.

It is to be noted that this example is not limited to the case of 6H silicon carbide, but the same effect can be obtained in cases of silicon carbide having other crystal systems.

EXAMPLE 10

Now, there is explained an example of a semiconductor device employing a silicon carbide substrate as shown in the above Examples 6 to 8.

Figure 11:
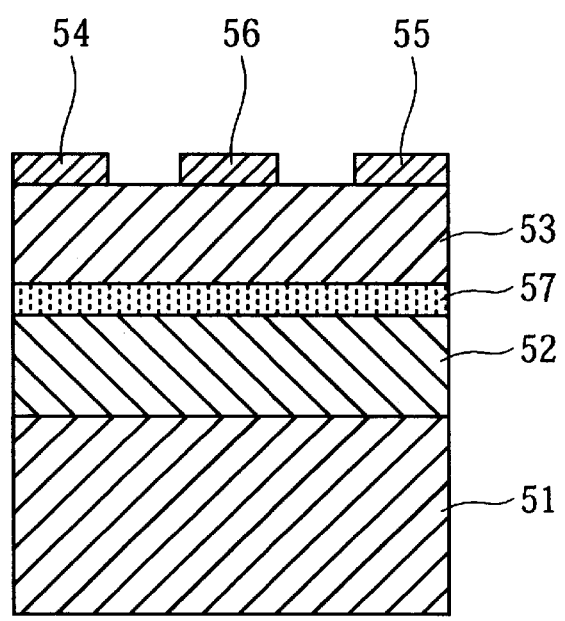
FIG. 11 is a cross-sectional view showing a construction of a semiconductor device in accordance with Example 10.

In this semiconductor device, a cubic silicon carbide layer 52 (second silicon carbide crystal) is stacked on a semi-insulating hexagonal silicon carbide substrate 51 (first silicon carbide crystal) with an abrupt hetero-interface therebetween, and a doped hexagonal silicon carbide layer 53 (first silicon carbide crystal) in which nitrogen (N) is doped is stacked on the cubic silicon carbide layer 52. See FIG. 11. This layered structure is formed in accordance with the methods shown in the above Example 6 to 8.

On the above doped hexagonal silicon carbide layer 53, a source electrode 54, a drain electrode 55, and a gate electrode 55 are provided. The source electrode 54 and drain electrode 55 are formed by a deposition of nickel (Ni) and a photolithography, and alloyed by being subjected to a heat treatment with argon (Ar) at 1000° C. for 3 minutes. The source electrode 54 and drain electrode 55 are in ohmic contact with the doped hexagonal silicon carbide layer 53. The gate electrode is formed by a deposition of gold (Au) and a photolithography, and is in Schottky-contact with the doped hexagonal silicon carbide layer 53.

A two-dimensional electron layer 57 in the interface of the cubic silicon carbide layer 52 and the doped hexagonal silicon carbide layer 53, composed of carriers, affects the electrical conduction between the source electrode 54 and the drain electrode 55. In other words, the two-dimensional electron layer 57 is controlled corresponding to a bias potential applied to the gate electrode 56, and the state of continuity between the source electrode 54 and the drain electrode 55 is changed, enabling one to operate the device as a high-speed FET. Specifically, in a device with a gate interval of 1 μm, a gain is observed at a frequency of 10 MHz or higher.

INDUSTRIAL APPLICABILITY

As has been described thus far, according to the present invention, by supplying silicon atoms and carbon atoms in such a way that the silicon atoms are slightly in excess of the carbon atoms in a step-flow growth of a silicon carbide crystal, an epitaxial growth of silicon carbide thin film with a good crystal structure is achieved at a relatively low temperature, and moreover a high concentration nitrogen doping and a crystal growth in a selective region by masking are easily achieved. In addition, by a step-flow growth employing an off-cut substrate having the regions in which a silicon carbide crystal having a different crystal system from each other, it is possible to readily form a silicon carbide substrate in which silicon carbide crystals with a crystal system different from each other. Moreover, by constructing a semiconductor device using a silicon carbide substrate in which silicon carbide crystals having a crystal system different from each other are stacked, a semiconductor device capable of high-speed operation is attained. Hence, the present invention is useful in such fields as semiconductor substrates, various types of semiconductor apparatus using semiconductor devices, and the like.

What is claimed is:

1. A method of producing a silicon carbide substrate, comprising growing a silicon carbide crystal by supplying silicon atoms and carbon atoms on a surface of a silicon carbide substrate, wherein:
    said surface of said silicon carbide substrate on which said silicon carbide crystal is to be grown is an off-cut surface inclined 0.05° to 10° with respect to one of the faces selected from a (0001) face of a hexagonal silicon carbide crystal and a (111) face of a cubic silicon carbide crystal, and
    an amount of silicon atoms to be supplied and an amount of carbon atoms to be supplied are so controlled that the amount of silicon atoms is in excess of the amount of carbon atoms on the surface of the silicon carbide substrate.

2. A method of producing a silicon carbide substrate according to claim 1, in which:
    said silicon carbide crystal is a hexagonal silicon carbide crystal; and
    said surface of said silicon carbide substrate on which said silicon carbide crystal is to be grown is composed of a hexagonal silicon carbide crystal, and is an off-cut surface inclined towards approximately a <1$\bar{1}$00> direction with respect to a (0001) face of the hexagonal silicon carbide crystal.

3. A method of producing a silicon carbide substrate according to claim 1, in which:
    said silicon carbide crystal is a cubic silicon carbide crystal, and
    said surface of said silicon carbide substrate on which said silicon carbide crystal is to be grown is one of the off-cut surfaces selected from an off-cut surface inclined towards approximately a <1$\bar{1}$00> direction with respect to a {0001} face of a hexagonal silicon carbide and an off-cut surface inclined towards approximately a <112> direction with respect to a {111} face of a cubic silicon carbide crystal.

4. A method of producing a silicon carbide substrate according to claim 1, in which:
    said surface of said silicon carbide substrate on which said silicon carbide crystal is to be grown is a (0001) face of a hexagonal silicon carbide crystal,
    said silicon carbide crystal to be grown is a hexagonal silicon carbide crystal, and
    said amount of silicon atoms and said amount of carbon atoms are so controlled that a surface structure of said silicon carbide substrate falls between approximately a 1×1 surface structure and approximately $\sqrt{3}\times\sqrt{3}$ surface reconstruction structure.

5. A method of producing a silicon carbide substrate according to claim 1, in which:
    said surface of said silicon carbide substrate on which said silicon carbide crystal is to be grown is one of the faces selected from a (0001) face of a hexagonal silicon carbide crystal and a (111) face of a cubic silicon carbide crystal,
    said silicon carbide crystal to be grown is a cubic silicon carbide crystal, and
    said amount of silicon atoms and said amount of carbon atoms are so controlled that a surface structure of said silicon carbide substrate falls between approximately a 1×1 surface structure and approximately a 3×3 surface reconstruction structure.

6. A method of producing a silicon carbide substrate according to claim 1, in which:
    said surface of said silicon carbide substrate on which said silicon carbide crystal is to be grown is a (000$\bar{1}$) face of a hexagonal silicon carbide crystal,
    said silicon carbide crystal to be grown is a hexagonal silicon carbide crystal, and
    said amount of silicon atoms and said amount of carbon atoms are so controlled that a surface structure of said silicon carbide substrate falls between approximately a 1×1 surface structure and approximately a 3×3 surface reconstruction structure.

7. A method of producing a silicon carbide substrate according to claim 1, in which:
    said surface of said silicon carbide substrate on which said silicon carbide crystal is to be grown is one of the faces selected from a (000$\bar{1}$) face of a hexagonal silicon carbide crystal and a ($\bar{1}\bar{1}\bar{1}$) face of a cubic silicon carbide crystal,
    said silicon carbide crystal to be grown is a cubic silicon carbide crystal, and said amount of silicon atoms and said amount of carbon atoms are so controlled that a surface structure of said silicon carbide substrate falls between approximately a 1×1 surface structure and approximately a 3×3 surface reconstruction structure.

8. A method of producing a silicon carbide substrate according to claim 1, in which:
said silicon atoms are supplied on said surface of said silicon carbide substrate on which said silicon carbide crystal is to be grown; and
said amount of silicon atoms is so controlled that the number of excessive silicon atoms on said surface of the silicon carbide substrate bonded with said surface of the silicon carbide substrate by a silicon-silicon bond is not more than the number corresponding to 5 atomic layers in said silicon carbide crystal.

9. A method of producing a silicon carbide substrate according to claim 1, in which at least either one of said silicon atoms or said carbon atoms is intermittently supplied.

10. A method of producing a silicon carbide substrate according to claim 9, in which said silicon atoms are consecutively supplied while said carbon atoms are intermittently supplied.

11. A method of producing a silicon carbide substrate according to claim 1, in which:
said silicon atoms and said carbon atoms are intermittently supplied each at a different timing,
a supply of said silicon atoms is carried out until a surface reconstruction structure of said silicon carbide substrate becomes one of the surface reconstruction structures selected from an approximately $\sqrt{3}\times\sqrt{3}$ surface reconstruction structure and an approximately 3×3 surface reconstruction structure, and
a supply of said carbon atoms is carried out until said surface reconstruction structure of said silicon carbide substrate becomes approximately a 1×1 surface reconstruction structure.

12. A method of producing a silicon carbide substrate according to claim 1, in which said silicon carbide crystal is grown under the condition in which a surface temperature of said silicon carbide substrate is kept within the range of 600° C. to 1300° C.

13. A method of producing a silicon carbide substrate according to claim 12, in which nitrogen is doped in said silicon carbide crystal by supplying a nitrogen-containing reactive gas on a surface of said silicon carbide substrate.

14. A method of producing a silicon carbide substrate according to claim 12, in which said silicon carbide crystal is grown on a predetermined region in said silicon carbide substrate by covering said silicon carbide substrate with a member for masking having a predetermined mask pattern.

15. A method of producing a silicon carbide substrate according to claim 14, in which said member for masking is a silicon oxide thin film.

16. A method of producing a silicon carbide substrate according to claim 1, in which:
said surface of said silicon carbide substrate on which said silicon carbide crystal is to be grown is one of the faces selected from a (0001) face of a hexagonal silicon carbide crystal and a {111} face of a cubic silicon carbide crystal, and
said surface of said silicon carbide substrate is cleaned prior to a crystal growth of said silicon carbide crystal so that a surface reconstruction structure of said silicon carbide substrate becomes approximately a $\sqrt{3}\times\sqrt{3}$ surface reconstruction structure.

17. A method of producing a silicon carbide substrate according to claim 16, in which said surface of said silicon carbide substrate is cleaned by heating said silicon carbide substrate in an atmosphere selected from hydrogen and vacuum so that a surface temperature of said silicon carbide substrate is within the range of 800° C. to 1300° C.

18. A method of producing a silicon carbide substrate in which a plurality of silicon carbide crystals, each having a crystal system different from each other are stacked, said method comprising the steps of:
forming a pretreatment substrate, wherein, on a portion of a surface of a silicon carbide substrate comprising a first silicon carbide crystal, a second silicon carbide crystal having a crystal system different from that of said first silicon carbide crystal is formed so that an inclination of a crystal face of the second silicon carbide crystal becomes identical to an inclination of a crystal face of said first silicon carbide crystal, said inclination of the crystal face of said first silicon carbide crystal being inclined 0.05° to 10° with respect to one of the faces selected from a (0001) face of a hexagonal silicon carbide crystal and a (111) face of a cubic silicon carbide crystal; and
forming a layered structure of said plurality of silicon carbide crystals, each having a different crystal system by growing said first silicon carbide crystal and said second silicon carbide crystal in said pretreatment substrate by utilizing a step-flow growth, so that silicon carbide crystals, each having the same crystal system as that of said first silicon carbide crystal or said second silicon carbide crystal is formed from each step edge of said first silicon carbide crystal and said second silicon carbide crystal.

19. A method of producing a silicon carbide substrate according to claim 18, in which said step of forming a pretreatment substrate comprises a step of growing said second silicon carbide crystal in a predetermined region on an original silicon carbide substrate having said first silicon carbide crystal by utilizing the step-flow growth.

20. A method of producing a silicon carbide substrate according to claim 18, in which said step of forming a pretreatment substrate comprises the steps of:
growing said second silicon carbide crystal on an original silicon carbide substrate having said first silicon carbide crystal by utilizing the step-flow growth, and
partially exposing said first silicon carbide crystal by removing a predetermined region of said second silicon carbide crystal.

21. A method of producing a silicon carbide substrate according to claim 18, in which:
said first silicon carbide crystal is a hexagonal silicon carbide crystal; and
said second silicon carbide crystal is a cubic silicon carbide crystal formed by a step-flow growth of a predetermined region of said second silicon carbide crystal.

22. A method of producing a silicon carbide substrate according to claim 18, in which:
said first silicon carbide crystal is a 4H hexagonal silicon carbide crystal; and
said second silicon carbide crystal is a 6H hexagonal silicon carbide crystal formed by a step-flow growth of a predetermined region of said second silicon carbide crystal.

23. A method of producing a silicon carbide substrate according to claim 18, in which:

a surface of said first silicon carbide crystal is an off-cut surface inclined 0.05° to 10° with respect to a (0001) face of a hexagonal silicon carbide crystal, and said silicon carbide grown from said second silicon carbide crystal is grown from said second silicon carbide crystal such that an amount of silicon atoms to be supplied and an amount of carbon atoms to be supplied are so controlled that said amount of silicon atoms is in excess of said amount of carbon atoms in a predetermined region on a surface of said first silicon carbide crystal.

24. A method of producing a silicon carbide substrate according to claim 23, in which said surface of said silicon carbide crystal grown from said first silicon carbide substrate is an off-cut surface inclined towards approximately a <1$\bar{1}$00> direction with respect to a (0001) face of a hexagonal silicon carbide crystal.

25. A method of producing a silicon carbide substrate according to claim 23, in which said silicon carbide crystal grown from said second silicon carbide crystal is grown under the condition where a temperature of said surface of said first silicon carbide crystal is kept within the range of 600° C. to 1800° C.

26. A silicon carbide substrate comprising a silicon carbide crystal grown by supplying silicon atoms and carbon atoms on a surface of a silicon carbide substrate, characterized in that:

said surface of said silicon carbide substrate on which said silicon carbide crystal is to be grown is an off-cut surface inclined 0.05° to 10° with respect to one of the faces selected from a {0001} face of a hexagonal silicon carbide crystal and a {111} face of a cubic silicon carbide crystal, and an amount of silicon atoms to be supplied and an amount of carbon atoms to be supplied are so controlled that said amount of silicon atoms is in excess of said amount of carbon atoms.

27. A silicon carbide substrate according to claim 26, in which:

said silicon carbide crystal is a cubic silicon carbide crystal, said surface of said silicon carbide substrate on which said silicon carbide crystal is to be grown is an off-cut surface inclined towards approximately a <1$\bar{1}$00> direction with respect to a {0001} face of a hexagonal silicon carbide crystal, and said silicon carbide crystal has a defect-free single crystal surface in a region of not less than 1 mm square.

28. A silicon carbide substrate according to claim 26, in which at least 5×10$^{18}$/cm$^3$ of nitrogen is contained in substitutional sites in said silicon carbide crystal by supplying a nitrogen-containing reactive gas on a surface of said silicon carbide substrate in growing said silicon carbide crystal.

29. A silicon carbide substrate comprising a silicon carbide crystal grown by supplying silicon atoms and carbon atoms on a surface of a silicon carbide substrate, characterized in that:

said silicon carbide crystal has a different crystal system from a crystal system of said silicon carbide substrate on which said silicon carbide crystal is to be grown, and said silicon carbide crystal is grown in a predetermined selective region in said silicon carbide substrate.

30. A silicon carbide substrate comprising a silicon carbide crystal grown utilizing a step-flow growth by supplying silicon atoms and carbon atoms on a surface of a silicon carbide substrate, characterized in that:

said silicon carbide crystal is one of the crystals selected from a hexagonal silicon carbide crystal and a cubic silicon carbide crystal, and said surface of said silicon carbide substrate has one of the step edges selected from a step edge of a [11$\bar{2}$0] direction of a hexagonal silicon carbide crystal and a step edge of a [110] direction of a cubic silicon carbide crystal.

31. A silicon carbide substrate comprising a silicon carbide crystal grown utilizing a step-flow growth by supplying silicon atoms and carbon atoms on a surface of a silicon carbide substrate, characterized in that:

said silicon carbide crystal is one of the crystals selected from a hexagonal silicon carbide crystal and a cubic silicon carbide crystal, said surface of said silicon carbide substrate on which said silicon carbide crystal is to be grown is one of the off-cut surfaces selected from an off-cut surface inclined towards approximately a <1$\bar{1}$00> direction with respect to a {0001} face of a hexagonal silicon carbide crystal and an off-cut surface inclined towards approximately a <112> direction with respect to a {111} face of a cubic silicon carbide crystal, and a surface roughness of said silicon carbide crystal is 10 nm or lower.

32. A silicon carbide substrate comprising a first silicon carbide crystal and a second silicon carbide crystals each being a single phase and having a crystal system different from each other, wherein;

said substrate has a structure comprising at least two layers of said first silicon carbide crystal and at least one layer of said second silicon carbide crystal, said at least one layer of second silicon carbide crystal being sandwiched between said at least two layers of first silicon carbide crystal; and each of said layers is stacked with an abrupt interface therebetween.

33. A silicon carbide substrate according to claim 32, in which, in a pretreatment substrate having a plurality of regions each with a silicon carbide crystal having a different crystal system from each other formed therein, said silicon carbide crystal in each region is grown by a step-flow growth.

34. A silicon carbide substrate according to claim 33, in which, in said pretreatment substrate, said plurality of regions of silicon carbide crystals is composed of an original silicon carbide substrate having an off-cut surface inclined 0.05° to 10° with respect to a {0001} face of a hexagonal silicon carbide crystal and a silicon carbide crystal formed by controlling an amount of silicon atoms to be supplied and an amount of carbon atoms to be supplied so that said amount of silicon atoms is in excess of said amount of carbon atoms.

35. A silicon carbide substrate according to claim 34, in which a surface of said original silicon carbide substrate is an off-cut surface inclined towards a <1$\bar{1}$00> direction with respect to a {0001} face of a hexagonal silicon carbide crystal.

36. A silicon carbide substrate according to claim 32, in which said first silicon carbide crystal is one of either a hexagonal silicon carbide crystal having a {0001} face or a cubic silicon carbide crystal having a {111} face, and said second silicon carbide crystal is the other one of either a hexagonal silicon carbide crystal having a {0001} face or a cubic silicon carbide crystal having a {111} face, and either one of said first silicon carbide crystal or said second silicon carbide crystal is stacked on either of said faces of the other one of said first silicon carbide crystal or said second silicon carbide crystal.

37. A silicon carbide substrate according to claim 32, in which said first silicon carbide crystal is one of either a 6H hexagonal silicon carbide crystal having a {0001} face or a 4H hexagonal silicon carbide crystal having a {0001} face, and said second silicon carbide crystal is the other one of either a 6H hexagonal silicon carbide crystal having a {0001} face or a 4H hexagonal silicon carbide crystal having a {0001} face, and either one of said first silicon carbide crystal or said second silicon carbide crystal is stacked on either of said faces of the other one of said first silicon carbide crystal or said second silicon carbide crystal.

38. A silicon carbide substrate according to claim 32, further comprising 2 layers of said first silicon carbide crystal and 1 layer of said second silicon carbide crystal, in which:

said first silicon carbide crystal is a hexagonal silicon carbide crystal having a {0001} face, said second silicon carbide crystal is a cubic silicon carbide crystal having a {111} face, and said 1 layer of said second silicon carbide crystal is stacked between said 2 layers of said first silicon carbide crystal.

39. A silicon carbide substrate according to claim 32, further comprising 2 layers of said first silicon carbide crystal and 1 layer of said second silicon carbide crystal, in which:

said first silicon carbide crystal is a 4H hexagonal silicon carbide crystal having a {0001} face, said second silicon carbide crystal is a 6H hexagonal silicon carbide crystal having a {0001} face, and said 1 layer of said second silicon carbide crystal is stacked between said 2 layers of said first silicon carbide crystal.

40. A semiconductor device comprising a silicon carbide substrate in which a first silicon carbide crystal and a second silicon carbide crystal are stacked with an abrupt interface therebetween, said first silicon carbide crystal and a second silicon carbide crystal each having a different crystal system from each other and being a single phase.

* * * * *